United States Patent
Chi et al.

(10) Patent No.: US 9,673,171 B1
(45) Date of Patent: Jun. 6, 2017

(54) INTEGRATED CIRCUIT PACKAGING SYSTEM WITH CORELESS SUBSTRATE AND METHOD OF MANUFACTURE THEREOF

(71) Applicants: HeeJo Chi, Yeoju-gun (KR); HeeSoo Lee, Anyang-si (KR); Omin Kwon, Icheon-si (KR)

(72) Inventors: HeeJo Chi, Yeoju-gun (KR); HeeSoo Lee, Anyang-si (KR); Omin Kwon, Icheon-si (KR)

(73) Assignee: STATS ChipPAC Pte. Ltd., Singapore (SG)

( * ) Notice: Subject to any disclaimer, the term of this patent is extended or adjusted under 35 U.S.C. 154(b) by 38 days.

(21) Appl. No.: 14/226,711

(22) Filed: Mar. 26, 2014

(51) Int. Cl.
  *H01L 23/02* (2006.01)
  *H01L 25/065* (2006.01)
  *H01L 25/00* (2006.01)

(52) U.S. Cl.
  CPC .......... *H01L 25/0652* (2013.01); *H01L 25/50* (2013.01)

(58) Field of Classification Search
  CPC . H01L 2924/15311; H01L 2224/73253; H01L 2225/1058; H01L 24/14; H01L 24/17; H01L 24/81; H01L 24/82; H01L 23/5389; H01L 24/29; H01L 24/30; H01L 23/49816; H01L 224/32145; H01L 2224/81; H01L 2224/12105; H01L 2224/04105; H01L 2224/82; H01L 25/0657; H01L 23/49827

USPC ......... 257/E23.069, E25.013, 686, 737, 738; 438/107, 124, 127, 126, 613
  See application file for complete search history.

(56) References Cited

U.S. PATENT DOCUMENTS

| | | | |
|---|---|---|---|
| 7,078,788 B2 | 7/2006 | Vu et al. | |
| 7,312,536 B2 | 12/2007 | Yamano et al. | |
| 7,320,173 B2 | 1/2008 | Lee et al. | |
| 7,449,363 B2 | 11/2008 | Hsu | |
| 7,563,987 B2 | 7/2009 | Sunohara et al. | |
| 7,573,135 B2 | 8/2009 | Sunohara et al. | |
| 8,227,927 B2 | 7/2012 | Chen et al. | |
| 8,335,084 B2 | 12/2012 | Lee et al. | |
| 2002/0127780 A1* | 9/2002 | Ma et al. ..................... 438/127 |
| 2003/0112604 A1* | 6/2003 | Hsu ..................... H01L 23/3128 361/719 |
| 2005/0248029 A1 | 11/2005 | Chang | |
| 2006/0115931 A1* | 6/2006 | Hsu .......................... H01L 24/24 438/121 |
| 2010/0255673 A1* | 10/2010 | Hayashi ................ H01L 21/563 438/613 |
| 2011/0063805 A1* | 3/2011 | Kim ..................... H01L 25/0657 361/743 |
| 2011/0084382 A1* | 4/2011 | Chen et al. ................... 257/737 |
| 2011/0193225 A1* | 8/2011 | Chen ....................... H01L 24/82 257/737 |

(Continued)

*Primary Examiner* — Khiem D Nguyen
(74) *Attorney, Agent, or Firm* — Wong & Rees LLP

(57) ABSTRACT

An integrated circuit packaging system and method of manufacture thereof includes: providing a semiconductor die having semiconductor die contacts; depositing an insulation layer on the semiconductor die including the semiconductor die contacts exposed; applying a conductive layer on the semiconductor die contacts and the insulation layer; and coupling system interconnects to the conductive layer for electrically connecting the semiconductor die to the system interconnects.

20 Claims, 6 Drawing Sheets

(56) References Cited

U.S. PATENT DOCUMENTS

| | | | |
|---|---|---|---|
| 2011/0215464 A1* | 9/2011 | Guzek | H01L 21/568 257/737 |
| 2012/0038053 A1* | 2/2012 | Oh | H01L 21/561 257/773 |
| 2012/0104581 A1* | 5/2012 | Yeh | H01L 21/561 257/675 |
| 2013/0026632 A1* | 1/2013 | Kikuchi | H01L 21/6835 257/753 |
| 2014/0008814 A1 | 1/2014 | Chen et al. | |

* cited by examiner

INTEGRATED CIRCUIT PACKAGING SYSTEM WITH CORELESS SUBSTRATE AND METHOD OF MANUFACTURE THEREOF

TECHNICAL FIELD

The present invention relates generally to an integrated circuit packaging system, and more particularly to a system for packaging integrated circuit die with a coreless substrate.

BACKGROUND ART

Electronic products have become an integral part of our daily lives. Packages of components such as semiconductor circuits, transistors, diodes, and other electronic devices have become smaller and thinner with more function and connections. In packaging components, the need for coupling components together in a reliable manner can influence the manufacturing processes.

The commercial demand for more function in less space can cause manufacturers to make compromises that decrease reliability or manufacturing yield. The additional pressure of cost reductions can pressure manufacturers to make compromises that can reduce the long term reliability of the integrated circuit products.

Thus, a need still remains for an integrated circuit packaging system that can reduce package size, support increased function, and maintain both manufacturing yield and long term reliability. In view of the extensive commercial pressures for high volume, small size, and reliability, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: providing a semiconductor die having semiconductor die contacts; depositing an insulation layer on the semiconductor die including the semiconductor die contacts exposed; applying a conductive layer on the semiconductor die contacts and the insulation layer; and coupling system interconnects to the conductive layer for electrically connecting the semiconductor die to the system interconnects.

The present invention provides an integrated circuit packaging system, including: a semiconductor die having semiconductor die contacts; an insulation layer on the semiconductor die including the semiconductor die contacts exposed from the insulation layer; a conductive layer on the semiconductor die contacts and the insulation layer; and system interconnects coupled to the conductive layer for electrically connecting the semiconductor die to the system interconnects.

Certain embodiments of the invention have other steps or elements in addition to or in place of those mentioned above. The steps or element will become apparent to those skilled in the art from a reading of the following detailed description when taken with reference to the accompanying drawings.

BEST MODE FOR CARRYING OUT THE INVENTION

Figure 1:
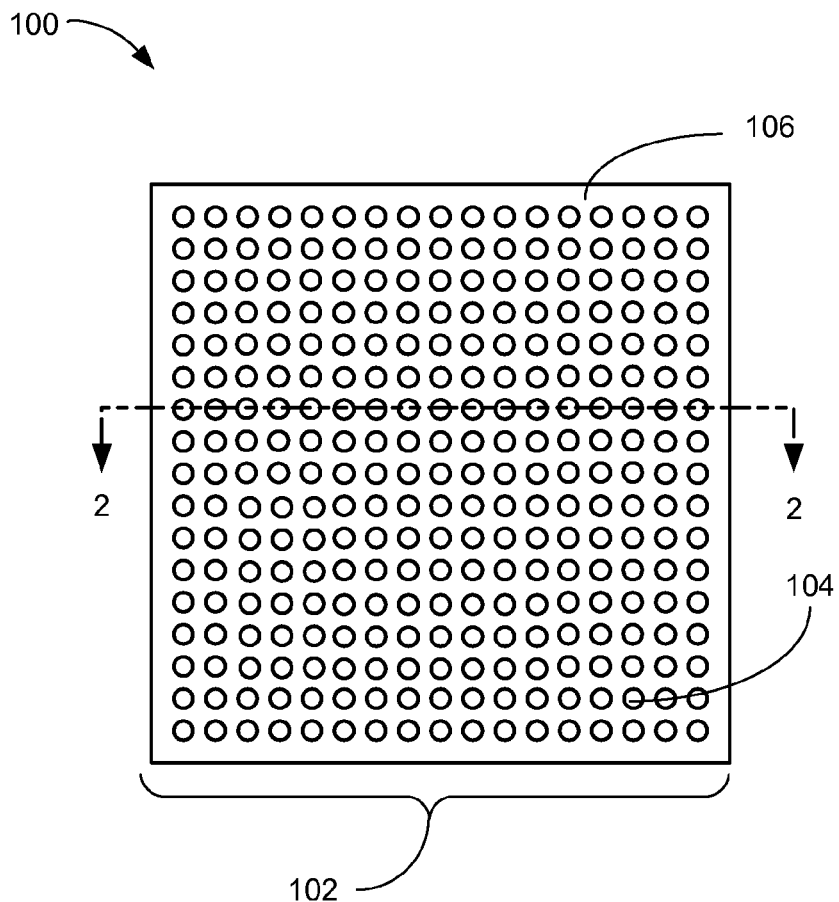
FIG. 1 is a bottom view of a first embodiment of an integrated circuit packaging system.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

The same numbers are used in all the drawing FIGs. to relate to the same elements. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or active surface of the semiconductor die, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" means there is direct physical contact between elements with no intervening elements.

The term "processing" as used herein includes deposition of material or photoresist, patterning, exposure, development, etching, cleaning, and/or removal of the material or photoresist as required in forming a described structure.

Referring now to FIG. 1, therein is shown a bottom view of a first embodiment of an integrated circuit packaging system 100. The bottom view of the first embodiment of the integrated circuit packaging system 100 depicts a base package 102 having an array of system interconnects 104 mounted in contact with a solder resist layer 106.

It is understood that the number and position of the system interconnects 104 is an example only and the actual number and position can differ. By way of an example the integrated circuit packaging system 100 is shown as a square shape having an equal number of columns and rows of the system interconnects 104, but it is understood that the system interconnects 104 can form any pattern on the integrated circuit packaging system 100. A section line 2-2 can show the position and direction of view of the integrated circuit packaging system 100 in FIG. 2.

Figure 2:
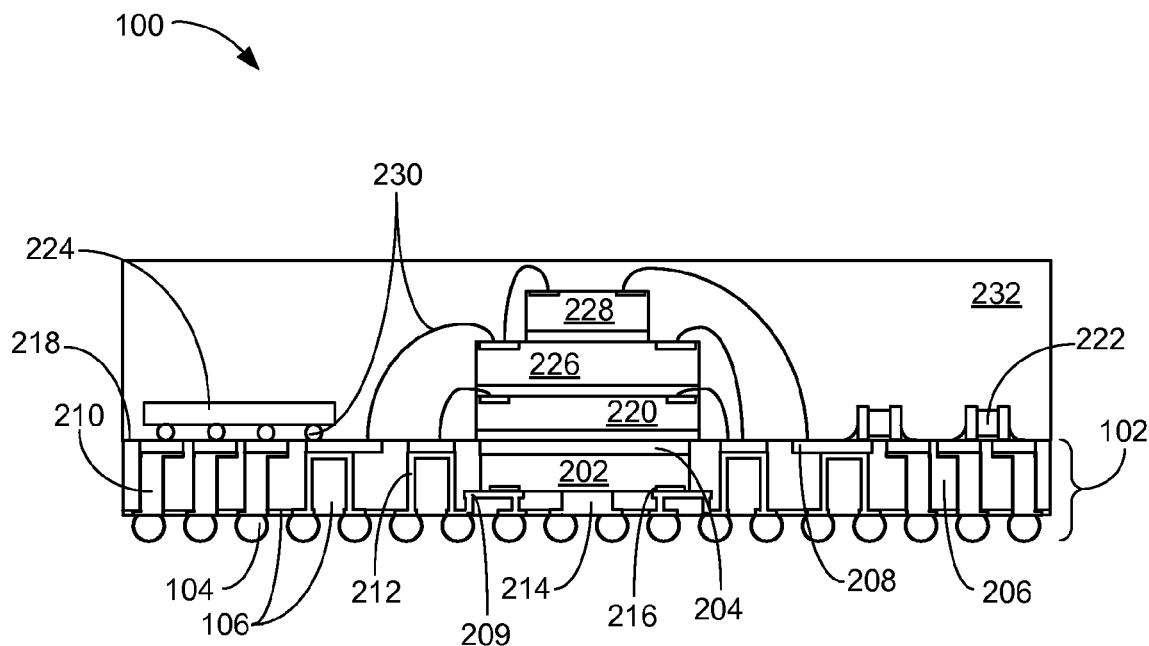
FIG. 2 is a cross-sectional view of the first embodiment of the integrated circuit packaging system along the section line 2-2 of FIG. 1.

Referring now to FIG. 2, therein is shown a cross-sectional view of the first embodiment of the integrated circuit packaging system 100 along the section line 2-2 of FIG. 1. The cross-sectional view of the first embodiment of the integrated circuit packaging system 100 depicts the base package 102 having a semiconductor die 202 with an inactive side coupled to an adhesive 204, such as a thermal adhesive, a die attach adhesive, a thermal epoxy, or the like.

An insulation layer 206 can be formed on the semiconductor die 202 and coplanar with the adhesive 204 and a contact layer 208, such as a copper foil layer, sputtered metal layer, or a patterned metal insert. The insulation layer 206 can have boundary regions plated with a conductive layer 209, such as copper, tin, nickel, silver, gold, or an alloy thereof, for forming filled vias 210, open vias 212, or a heat slug 214. The filled vias 210 can provide reliable, low resistance connections between the contact layer 208 and the system interconnects 104. The open vias 212 can be barrel shaped conductors formed in the insulation layer 206 and can be coupled directly on multiple of the system interconnects 104 in order to provide a reliable connection between the contact layer 208, semiconductor die contacts 216, and the system interconnects 104. The heat slug 214 can be formed of a thermally conductive material including copper foil, sputtered metal, a formed metal plug, thermal epoxy, or the like. The heat slug 214 can be in direct physical contact with an active side of the semiconductor die 202 and spaced away from the semiconductor die contacts 216.

The solder resist layer 106 can be formed on the insulation layer 206, the filled vias 210, the open vias, 212, and the heat slug 214. The solder resist layer 106 can be in contact with the system interconnects 104 and the inside region of the open vias 212.

It has been discovered that the base package 102 can provide a thin and reliable platform for assembling multiple integrated circuits in a single package format. The base package 102 is able to be tested prior to further assembly and can represent a reliable and manufacturable package substrate for assembly of additional electronic functions.

A planar component surface 218 of the base package 102 can provide a mounting surface for a first stacked integrated circuit 220, discrete analog components 222, a flip chip integrated circuit 224, or a combination thereof. The discrete analog components 222 can include resistors, capacitors, inductors, diodes, transistors, voltage regulators, oscillators, filters, or the like.

A second stacked integrated circuit 226 can be mounted over the first stacked integrated circuit 220. A third stacked integrated circuit 228 can be mounted over the first stacked integrated circuit 220 and the second stacked integrated circuit 226. Component interconnects 230, such as bond wires, solder bumps, solder paste, stud bumps, solder columns, or the like, can couple the first stacked integrated circuit 220, the discrete analog components 222, the flip chip integrated circuit 224, the second stacked integrated circuit 226, and the third stacked integrated circuit 228 to the contact layer 208 of the planar component surface 218. A molded package body 232 can be formed on the first stacked integrated circuit 220, the discrete analog components 222, the flip chip integrated circuit 224, the second stacked integrated circuit 226, and the third stacked integrated circuit 228 to the contact layer 208 of the planar component surface 218.

It has been unexpectedly discovered that an embodiment of the integrated circuit packaging system 100 can provide a flexible and high volume platform for integration of multiple functions, in different technologies, including integrated circuit logic, the discrete analog components 222, and thermal management features. The base package 102 can be fabricated in various forms and can include one or more of the semiconductor die 202 as part of the available function. The semiconductor die 202 can utilize the heat slug 214 for managing thermal reliability during operation.

Figure 3:
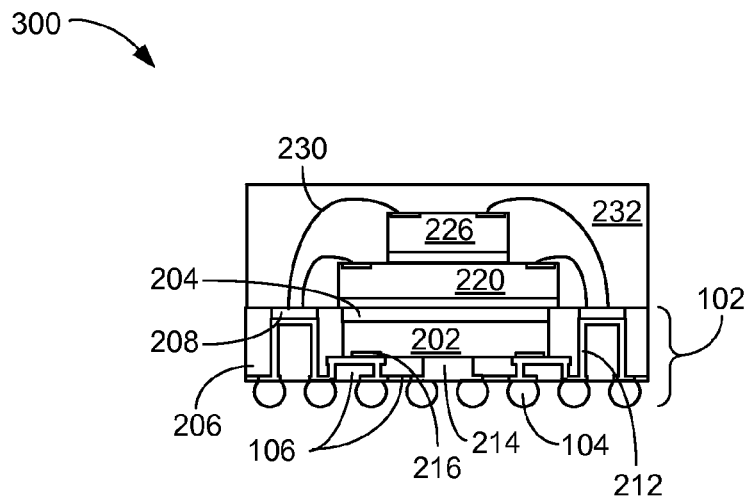
FIG. 3 is a cross-sectional view of a second embodiment of the integrated circuit packaging system along the section line 2-2 of FIG. 1.

Referring now to FIG. 3, therein is shown a cross-sectional view of a second embodiment 300 of the integrated circuit packaging system 100 along the section line 2-2 of FIG. 1. The cross-sectional view of a second embodiment 300 depicts the base package 102 having the semiconductor die 202 mounted on the adhesive 204.

The insulation layer 206 can be formed on the semiconductor die 202 to be coplanar with the adhesive 204 and the contact layer 208, such as a copper foil layer, sputtered metal layer, or a patterned metal insert. The insulation layer 206 can have boundary regions plated with a conductive material, such as copper, tin, nickel, silver, gold, or an alloy thereof, for forming the open vias 212 or the heat slug 214. The open vias 212 can be barrel shaped conductors formed in the insulation layer 206 and can be coupled to multiple of the system interconnects 104 in order to provide a reliable connection between the contact layer 208, the semiconductor die contacts 216, and the system interconnects 104. The heat slug 214 can be formed of a thermally conductive material including copper foil, sputtered metal, a formed metal plug, thermal epoxy, or the like. The heat slug 214 can be in direct physical contact with an insulated area of the active side of the semiconductor die 202.

The solder resist layer 106 can be formed on the insulation layer 206, the open vias, 212, and the heat slug 214. The solder resist layer 106 can be in contact with the system interconnects 104 and the inside region of the open vias 212.

The second embodiment 300 of the integrated circuit packaging system 100 can provide a reduced size while maintaining the ability to house the first stacked integrated circuit 220 and the second stacked integrated circuit 226. The component interconnects 230 can electrically connect the first stacked integrated circuit 220, the second stacked integrated circuit 226, and the semiconductor die 202 through the contact layer 208 and the open vias 212. A connection to the next level system (not shown) can be made through the system interconnects 104 coupled to the open vias 212.

The molded package body 232 can protect the component interconnects 230 and provide a rigid support for the base package 102. The shape of the molded package body 232 is an example only and the actual shape may differ. It is understood that the second embodiment 300 is an example of the possible configurations of the integrated circuit packaging system 100. The first stacked integrated circuit 220 and the second stacked integrated circuit 226 could be replaced by the flip chip integrated circuit 224 without changing the features of the second embodiment 300.

Figure 4:
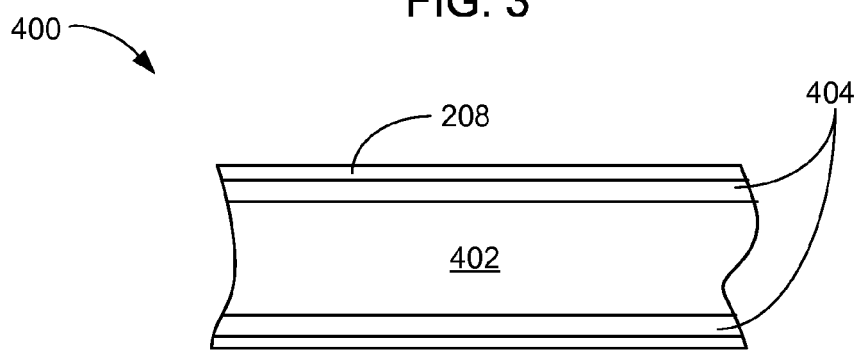
FIG. 4 is a cross-sectional view of a sub-assembly of the integrated circuit packaging system in a substrate forming phase of manufacturing.

Referring now to FIG. 4, therein is shown a cross-sectional view of a sub-assembly 400 of the integrated circuit packaging system 100 of FIG. 1 in a substrate forming phase of manufacturing. The cross-sectional view of a sub-assembly 400 depicts a manufacturing substrate 402 having a detachable material 404 on a top and bottom surfaces. The detachable material 404 can be any material that can provide a releasable structure. By way of an example, the detachable material 404 can be a "3 um Ni layer" between a "seed copper layer" and a "copperlayer". Due to low adhesion between copper and Ni, the substrate is easily detached from the core during a detaching process. The contact layer 208, such as a copper foil or sputtered metal layer, can be attached to the surface of the detachable material 404 opposite the manufacturing substrate 402. The detachable material 404 can be a thermally reactive adhesive that releases its adhesion with a thermal or ultrasonic stimulus.

It is understood that the thickness of the contact layer 208 can be greater than or less that the thickness of the manufacturing substrate 402. The manufacturing substrate 402 can be formed of metal, polymer, composition material, such as FR4, or the like. The detachable material 404 can be an ultra-violet releasable film that loses its adhesion when exposed to ultra-violet light. The detachable material 404 can include thermally releasable material, or any adhesive material that can be released by an external source.

By way of an example, the manufacturing substrate 402 can be formed of an FR4 core having a copper layer applied to the top and bottom surfaces, or the manufacturing substrate 402 can be formed of a stainless steel core having a multi-level metal coating, including a 10 micro-meter copper layer with a 3 micro-meter nickel layer and a 3 micro-meter copper seed layer. It is understood that the manufacturing substrate 402 can be formed of other materials and of different thicknesses in embodiments of the present invention.

It has been discovered that the manufacturing substrate 402 can provide assembly regions on both sides at the same time in order to double the productivity of the manufacturing process without increasing cost or compromising quality. It is understood that the manufacturing substrate 402 can be utilized on one side or both sides without changing the claimed embodiment of the invention.

Figure 5:
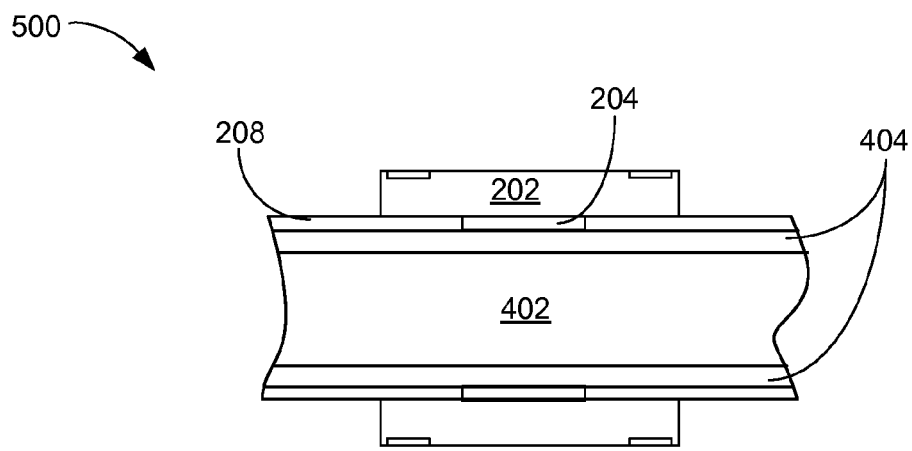
FIG. 5 is a cross-sectional view of a sub-assembly of the integrated circuit packaging system in a semiconductor die attach phase of manufacturing.

Referring now to FIG. 5, therein is shown a cross-sectional view of a sub-assembly 500 of the integrated circuit packaging system 100 of FIG. 1 in a semiconductor die 202 attach phase of manufacturing. The cross-sectional view of a sub-assembly 500 depicts the contact layer 208 having been patterned to provide individual regions for electrical connection within the base package 102 of FIG. 2. The patterning of the contact layer 208 can be performed by etching or laser ablation with the detachable material 404 acting as a stop layer.

The adhesive 204 has been disposed within the patterned regions between the contact layer 208 for mounting the semiconductor die 202. The inactive side of the semiconductor die 202 can be in contact with the adhesive 204. The active side of the semiconductor die 202 can face away from the manufacturing substrate 402. The semiconductor die 202 attach phase of manufacturing can process both sides of the manufacturing substrate 402 concurrently.

It is understood that the patterning of the contact layer 208 is an example only and the entire region beneath the semiconductor die can be removed. In the case that there is none of the contact layer 208 between the semiconductor die 202 and the detachable material 404, the adhesive 204 will only be applied to the space directly between the semiconductor die 202 and the detachable material 404.

Figure 6:
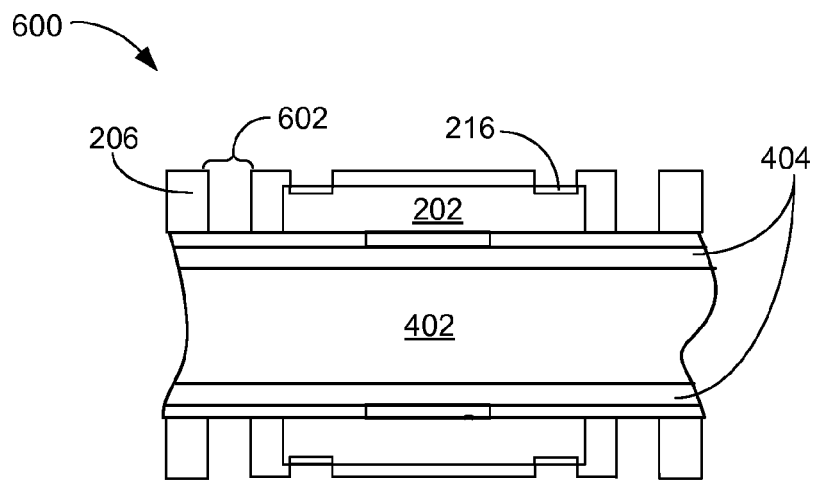
FIG. 6 is a cross-sectional view of a sub-assembly of the integrated circuit packaging system in an insulation layer forming phase of manufacturing.

Referring now to FIG. 6, therein is shown a cross-sectional view of a sub-assembly 600 of the integrated circuit packaging system 100 of FIG. 1 in an insulation layer 206 forming phase of manufacturing. The cross-sectional view of the sub-assembly 600 depicts the insulation layer 206 formed on the semiconductor die 202 and the contact layer 208. Via openings 602 can be formed in the insulation layer 206 for exposing the contact layer 208 and the semiconductor die contacts 216. Optionally the via opening 602 can also expose the insulated surface of the active side of the semiconductor die 202 separated from the semiconductor die contacts 216.

It is understood that the configuration of the sub-assembly 600 is built on both sides of the manufacturing substrate 402 at the same time. The detachable material 404 will subsequently allow the release of the finished package.

Figure 7:
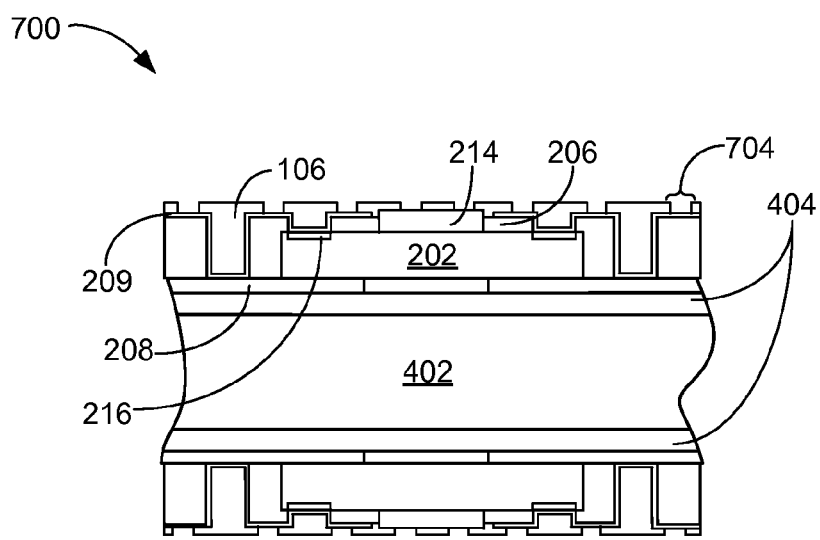
FIG. 7 is a cross-sectional view of a sub-assembly of the integrated circuit packaging system in a conductor deposition phase of manufacturing.

Referring now to FIG. 7, therein is shown a cross-sectional view of a sub-assembly 700 of the integrated circuit packaging system 100 of FIG. 1 in a conductor deposition phase of manufacturing. The cross-sectional view of the sub-assembly 700 depicts a conductive material 209, such as a metal, alloy, or conductive epoxy, applied on all of the surfaces that were exposed in the sub-assembly 600 of FIG. 6. The conductive material 209 can subsequently be patterned to form circuits for electrical connection to the semiconductor die 202 or through the base package 102 of FIG. 2.

The conductive material 209 can provide an electrically conductive path to the contact layer 208 and the semiconductor die contacts 216. Optionally the conductive material 209 can form the heat slug 214 on the insulated region of the active side of the semiconductor die 202. It is understood that the area of the active region of the semiconductor die 202 that is away from the semiconductor die contacts 216 will be coated by a polysilicon material to electrically insulate the circuits within the semiconductor die 202 from external electrical contact but is a good conductor of heat. The forming of the heat slug 214 directly on the area of the active region of the semiconductor die 202 that is away from the semiconductor die contacts 216 will provide a very efficient thermal management feature without adding additional components or processes.

Based on the intended use of the base package 102 the conductive material 209 can be used to fill the via opening 602 of FIG. 6 in order to form the filled vias 210 of FIG. 2 or just to coat the sidewalls of the via opening 602 in order to form the open vias 212 of FIG. 2. The solder resist layer 106 can be formed on the conductive material 209, the insulation layer 206 and the heat slug 214. The solder resist layer 106 can then be patterned to provide access sites 704 for electrical connection to the system interconnects 104 of FIG. 1. It is understood that the configuration of the sub-assembly 700 is built on both sides of the manufacturing substrate 402 at the same time. The detachable material 404 will subsequently allow the release of the finished package.

Figure 8:
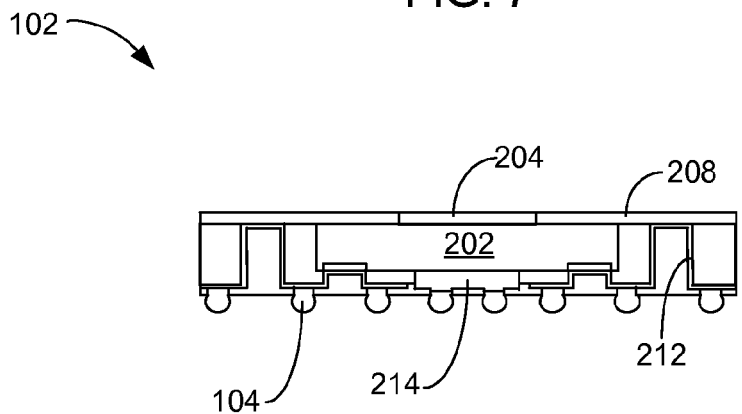
FIG. 8 is a cross-sectional view of the embodiment of the base substrate in a package separation phase of manufacturing.

Referring now to FIG. 8, therein is shown a cross-sectional view of the embodiment of the base package 102 in a package separation phase of manufacturing. The cross-sectional view of the embodiment of the base package 102 depicts the base package 102 having been released from the manufacturing substrate 402 of FIG. 7 by activating the detachable material 404 of FIG. 7. The activation of the detachable material 404 can be the result of a change in temperature, being subject to ultra-sonic energy, being subject to ultra-violet light, or the like.

The features of the base package 102, including the semiconductor die 202 coupled to the system interconnects 104 by the open vias 212, can function as a stand-alone integrated circuit package and can be tested as such prior to additional assembly. The addition of the heat slug 214 can allow the base package 102 to integrate high power devices or large highly integrated versions of the semiconductor die 202. The inclusion of the contact layer 208 and the adhesive 204 can provide additional thermal management features as well as options for further electrical connections. The base package 102 can support electrical connections between the semiconductor die 202, the system interconnects 104, the contact layer 208 or a combination thereof. The contact layer 208 exposed on a coplanar surface of the base package 102 opposite the system interconnects 104 can provide for additional vertical integration of the first stacked integrated circuit 220 of FIG. 2, the discrete analog components 222 of FIG. 2, a flip chip integrated circuit 224 of FIG. 2, or a combination thereof.

Figure 9:
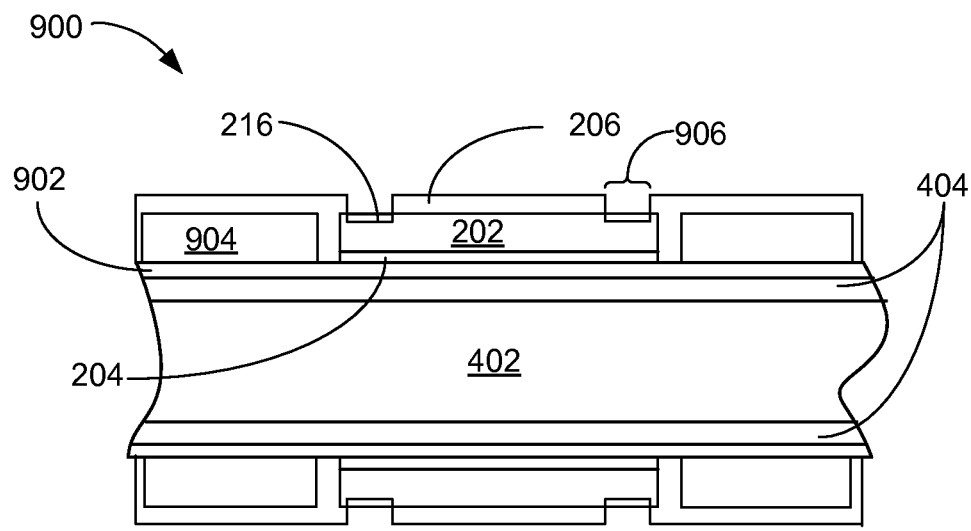
FIG. 9 is a cross-sectional view of a sub-assembly of a third embodiment of the integrated circuit packaging system in an insulation layer forming phase of manufacturing.

Referring now to FIG. 9, therein is shown a cross-sectional view of a sub-assembly 900 of a third embodiment of the integrated circuit packaging system 100 of FIG. 1 in an insulation layer forming phase of manufacturing. The cross-sectional view of the third embodiment 900 depicts the manufacturing substrate 402 having the detachable material 404 on opposing surfaces.

A heat spreader 902 can optionally be attached to the detachable material 404. The heat spreader 902 can be a copper film, a plate, a sputtered metal layer, or a thermal epoxy. The semiconductor die 202 can be attached to the heat spreader 902 by the adhesive 204, such as a thermal interface material, a die attach material, or thermal epoxy. In the event the heat spreader 902 is not implemented, the adhesive 204 can be attached directly to the detachable material 404.

A stiffener 904 can be attached to the heat spreader 902 and completely surrounds the semiconductor die 202. The stiffener 904 can be formed from a metal sheet, preformed and cured thermal epoxy, preformed and cured epoxy molding compound, or a thermal crystal. The stiffener 904 can be attached to the heat spreader 902 by a die attach material. In the event the heat spreader 902 is not implemented, the stiffener 904 can be attached directly to the detachable material 404.

The insulation layer 206 can be formed on the heat spreader 902, the semiconductor die 202, the adhesive 204, and the stiffener 904. In the event the heat spreader 902 is not implemented, the insulation layer can be formed directly on the detachable material 404. The insulation layer 206 can be patterned to open channels 906 to expose the semiconductor die contacts 216 of the semiconductor die 202.

It has been discovered that the stiffener 904 can prevent the warping of a base package during the attachment to the next level system (not shown). The selection of the material of the stiffener 904 can provide additional thermal management for the semiconductor die 202 that generates excessive heat.

Figure 10:
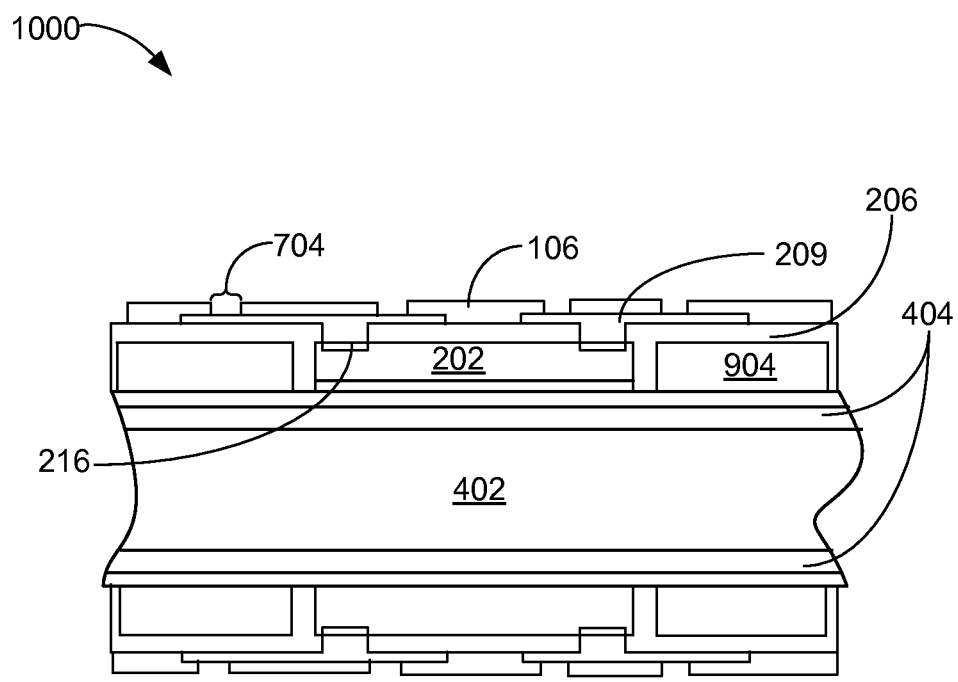
FIG. 10 is a cross-sectional view of a sub-assembly of the third embodiment of the integrated circuit packaging system in a contact forming phase of manufacturing.

Referring now to FIG. 10, therein is shown a cross-sectional view of a sub-assembly 1000 of the third embodiment of the integrated circuit packaging system 100 in a contact forming phase of manufacturing. The cross-sectional view of a sub-assembly 1000 depicts the conductive layer 209 deposited on the insulation layer 206 and the semiconductor die contacts 216 of the semiconductor die 202. Optionally the conductive layer 209 can be deposited through an opening in the insulation layer 206 to contact the stiffener 904 for providing an additional thermal management feature.

The solder resist layer 106 can be deposited on the conductive layer 209 and the insulation layer 206. The solder resist layer 106 can then be patterned to provide the access sites 704 for electrical connection to the system interconnects 104 of FIG. 1. It is understood that the configuration of the sub-assembly 1000 is built on both sides of the manufacturing substrate 402 at the same time. The detachable material 404 will subsequently allow the release of the base package.

Figure 11:
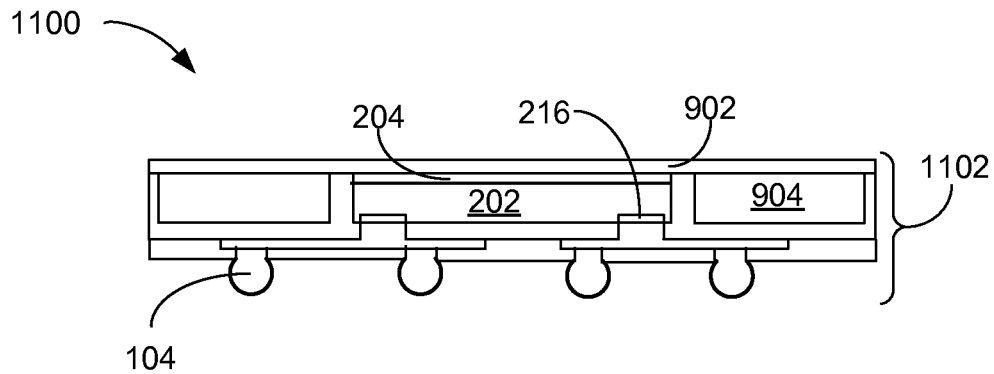
FIG. 11 is a cross-sectional view of the third embodiment of the integrated circuit packaging system in a package separation phase of manufacturing.

Referring now to FIG. 11, therein is shown a cross-sectional view of the third embodiment 1100 of the integrated circuit packaging system 100 in a package separation phase of manufacturing. The cross-sectional view of the third embodiment 1100 depicts a base package 1102 having the semiconductor die 202 physically and thermally coupled to the heat spreader 902 by the adhesive 204. The stiffener 904 can provide a rigid platform and prevents the warping of the base package 1102 during the reflow process of the system interconnects 104 during assembly.

It has been unexpectedly determined that the base package 1102 can provide an ultra-thin ball grid array package with thermal management features. The heat slug 214 of FIG. 2 can optionally be implemented in the area of the active region of the semiconductor die 202 that is away from the semiconductor die contacts 216 in order to provide a very efficient thermal management feature without adding additional components or processes. The optional combination the heat spreader 902, the stiffener 904, coupled to the system interconnects 104, and the heat slug 214 can provide extensive thermal management capable of supporting high power versions of the semiconductor die 202 in a high volume and reliable integrated circuit package.

Thus, it has been discovered that the integrated circuit packaging system and device or product of the embodiments of the present invention furnish important and heretofore unknown and unavailable solutions, capabilities, and functional aspects for manufacturing high volume flexible and reliable multi chip integrated circuit packages with thermal management features.

Figure 12:
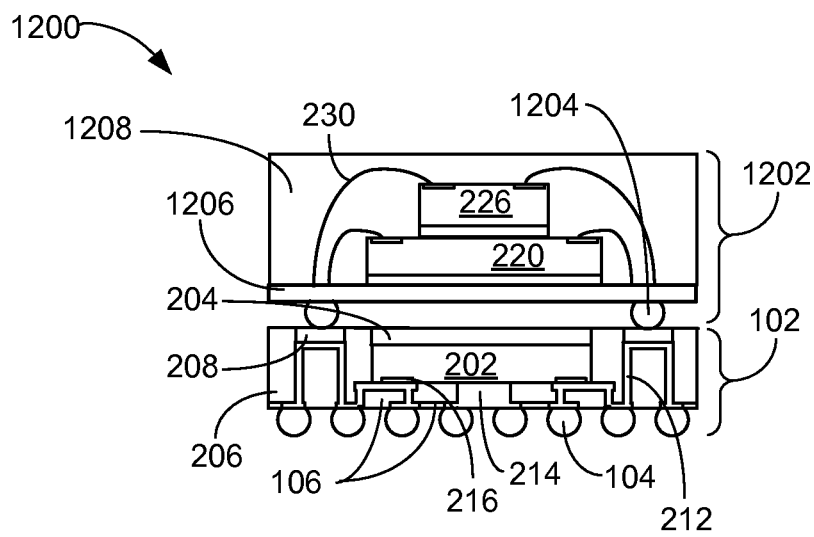
FIG. 12 is a cross-sectional view of a fourth embodiment of the integrated circuit packaging system along the section line substantially similar to 2-2 of FIG. 1.

Referring now to FIG. 12, therein is shown a cross-sectional view of a fourth embodiment 1200 of the integrated circuit packaging system 100 along the section line substantially similar to 2-2 of FIG. 1. The cross-sectional view of the fourth embodiment 1200 of the integrated circuit packaging system 100 includes the base package 102 having a top package 1202 mounted by package interconnects 1204, such as solder balls, solder posts, solder bumps, stud bumps, or the like in a fan-out configuration.

The top package 1202 can include a top substrate 1206 having the first stacked integrated circuit 220 and the second stacked integrated circuit 226. A top package body 1208 can be formed of a molding compound, such as an epoxy molding compound, to cover the first stacked integrated circuit 220, the second stacked integrated circuit 226, and the component interconnects 230. The component interconnects 230 can electrically connect the first stacked integrated circuit 220, the second stacked integrated circuit 226, and the semiconductor die 202 through the package interconnects 1204, contact layer 208, and the open vias 212.

Figure 13:
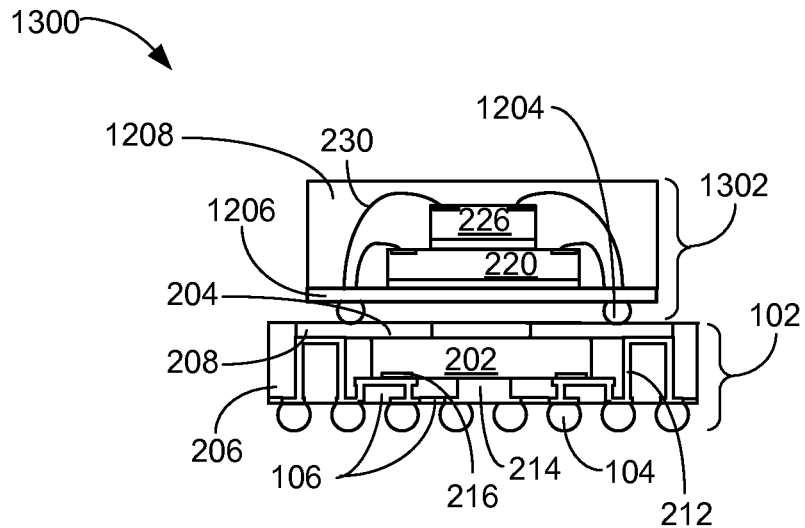
FIG. 13 is a cross-sectional view of a fifth embodiment of the integrated circuit packaging system along the section line substantially similar to 2-2 of FIG. 1.

Referring now to FIG. 13, therein is shown a cross-sectional view of a fifth embodiment 1300 of the integrated circuit packaging system 100 along the section line substantially similar to 2-2 of FIG. 1. The cross-sectional view of the fifth embodiment 1300 of the integrated circuit packaging system 100 includes the base package 102 having a top package 1302 mounted by package interconnects 1204, such as solder balls, solder posts, solder bumps, stud bumps, or the like in a fan-in configuration.

The top package 1302 can include the top substrate 1206 having the first stacked integrated circuit 220 and the second stacked integrated circuit 226. A top package body 1208 can be formed of a molding compound, such as an epoxy molding compound, to cover the first stacked integrated circuit 220, the second stacked integrated circuit 226, and the component interconnects 230. The component interconnects 230 can electrically connect the first stacked integrated circuit 220, the second stacked integrated circuit 226, and the semiconductor die 202 through the package interconnects 1204, contact layer 208, and the open vias 212.

Figure 14:
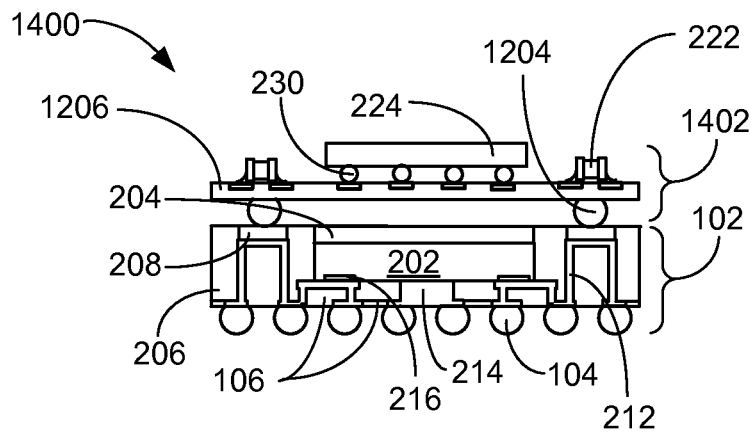
FIG. 14 is a cross-sectional view of a sixth embodiment of the integrated circuit packaging system along the section line substantially similar to 2-2 of FIG. 1.

Referring now to FIG. 14, therein is shown a cross-sectional view of a sixth embodiment 1400 of the integrated circuit packaging system 100 along the section line substantially similar to 2-2 of FIG. 1. The cross-sectional view of the sixth embodiment 1400 of the integrated circuit packaging system 100 includes the base package 102 having a top package 1402 mounted by package interconnects 1204, such as solder balls, solder posts, solder bumps, stud bumps, or the like in a fan-out configuration.

The top package 1402 can include the top substrate 1206 having the discrete analog components 222 and the flip chip integrated circuit 224 mounted thereon. The top package 1402 can be coupled to the base package 102 through the package interconnects 1204. It is understood that the top package 1402 can be implemented without the discrete analog components 222 without changing the embodiment of the invention. It is further understood that the top package 1402 can include the flip chip integrated circuit 224 having a different number of the component interconnects 230.

Figure 15:
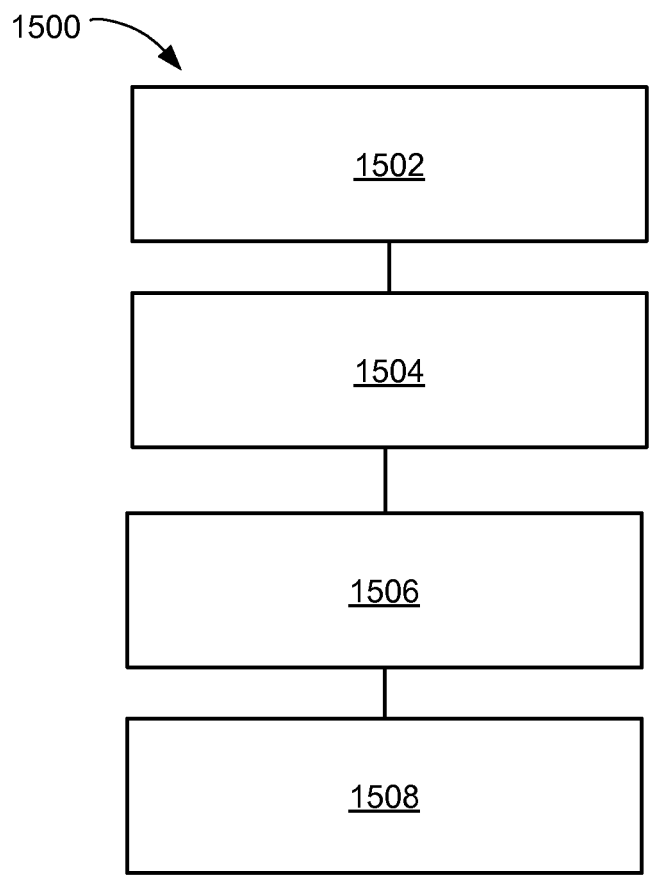
FIG. 15 is a flow chart of a method of manufacture of an integrated circuit packaging system in a further embodiment of the present invention.

Referring now to FIG. 15, therein is shown a flow chart of a method 1500 of manufacture of an integrated circuit packaging system in a further embodiment of the present invention. The method 1500 includes: providing a semiconductor die having semiconductor die contacts in a block 1502; depositing an insulation layer on the semiconductor die including the semiconductor die contacts exposed in a block 1504; applying a conductive layer on the semiconductor die contacts and the insulation layer in a block 1506; and coupling system interconnects to the conductive layer for electrically connecting the semiconductor die to the system interconnects in a block 1508.

The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing integrated circuit packaging systems fully compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
   depositing an insulation layer on a semiconductor die having semiconductor die contacts, the semiconductor die contacts exposed;
   applying a conductive layer on the semiconductor die contacts and the insulation layer, the applying including forming a heat slug directly on an active region of the semiconductor die, spaced away from the semiconductor die contacts; and
   coupling system interconnects directly on the conductive layer for electrically connecting the semiconductor die, the system interconnects, a contact layer, or a combination thereof in a base package having an adhesive layer and the contact layer each having an exposed surface that is coplanar with a surface of the base package that is opposite to the system interconnects, the system interconnects coupled on the heat slugs.

2. The method as claimed in claim 1 further comprising forming a planar component surface over the semiconductor die.

3. The method as claimed in claim 1 wherein applying the conductive layer on the semiconductor die contacts and the insulation layer includes forming open vias on the insulation layer.

4. The method as claimed in claim 1 further comprising:
   mounting a stacked integrated circuit over the semiconductor die;

coupling a component contact between the stacked integrated circuit and the conductive layer; and forming a molded package body on the stacked integrated circuit, the component contact and the insulation layer.

5. The method as claimed in claim 1 further comprising:
adhering a heat spreader over the semiconductor die by the adhesive layer; and
mounting a stiffener, to the heat spreader, adjacent to the semiconductor die and the adhesive layer.

6. A method of manufacture of an integrated circuit packaging system comprising:
depositing an insulation layer on a semiconductor die having semiconductor die contacts, the semiconductor die contacts exposed;
patterning a conductive layer on the semiconductor die contacts and the insulation layer, the patterning including forming a heat slug directly on an active region of the semiconductor die, spaced away from the semiconductor die contacts;
applying a solder resist layer on the conductive layer and the insulation layer, the applying including forming access sites over the conductive layer; and
coupling system interconnects, through the access sites, directly on the conductive layer for electrically connecting the semiconductor die, the system interconnects, a contact layer, or a combination thereof in a base package having an adhesive layer and the contact layer each having an exposed surface that is coplanar with a surface of the base package that is opposite to the system interconnects, the system interconnects coupled on the heat slugs.

7. The method as claimed in claim 6 further comprising forming a planar component surface over the semiconductor die wherein forming the planar component surface includes mounting the contact layer, on the conductive layer, coplanar with the insulation layer.

8. The method as claimed in claim 6 wherein patterning the conductive layer on the semiconductor die contacts and the insulation layer includes forming filled vias, open vias, the heat slug, or a combination thereof on the insulation layer.

9. The method as claimed in claim 6 further comprising:
positioning the contact layer over the semiconductor die;
mounting a stacked integrated circuit, a flip chip integrated circuit, discrete analog components, or a combination thereof over the contact layer;
coupling a component contact between the stacked integrated circuit, the flip chip integrated circuit, the discrete analog components, or the combination thereof and the contact layer; and
forming a molded package body on the stacked integrated circuit, the flip chip integrated circuit, the discrete analog components, or the combination thereof, the component contact and the insulation layer.

10. The method as claimed in claim 6 further comprising:
adhering a heat spreader over the semiconductor die by the adhesive layer;
attaching a stiffener, to the heat spreader, adjacent to the semiconductor die and the adhesive layer; and
wherein:
depositing the insulation layer on the semiconductor die includes forming the insulation layer on the heat spreader, the stiffener, and the adhesive layer.

11. An integrated circuit packaging system comprising:
a semiconductor die having semiconductor die contacts;
an insulation layer on the semiconductor die, the semiconductor die contacts exposed from the insulation layer;
a conductive layer on the semiconductor die contacts and the insulation layer, a heat slug formed directly on an active region of the semiconductor die, spaced away from the semiconductor die contacts; and
system interconnects coupled directly on the conductive layer for electrically connecting the semiconductor die, the system interconnects, a contact layer, or a combination thereof in a base package having an adhesive layer and the contact layer each having an exposed surface that is coplanar with a surface of the base package that is opposite to the system interconnects, the system interconnects coupled on the heat slugs.

12. The system as claimed in claim 11 further comprising a planar component surface formed over the semiconductor die.

13. The system as claimed in claim 11 wherein the conductive layer on the semiconductor die contacts and the insulation layer includes open vias formed on the insulation layer.

14. The system as claimed in claim 11 further comprising:
a stacked integrated circuit mounted over the semiconductor die;
a component contact coupled between the stacked integrated circuit and the conductive layer; and
a molded package body formed on the stacked integrated circuit, the component contact and the insulation layer.

15. The system as claimed in claim 11 further comprising:
a heat spreader adhered over the semiconductor die by the adhesive layer; and
a stiffener, mounted to the heat spreader, adjacent to the semiconductor die and the adhesive layer.

16. The system as claimed in claim 11 further comprising a solder resist layer applied on the conductive layer and the insulation layer including access sites, in the solder resist layer, over the conductive layer.

17. The system as claimed in claim 16 further comprising a planar component surface over the semiconductor die wherein the planar component surface includes the contact layer, on the conductive layer, coplanar with the insulation layer.

18. The system as claimed in claim 16 wherein the conductive layer on the semiconductor die contacts and the insulation layer includes filled vias, open vias, the heat slug, or a combination thereof formed on the insulation layer.

19. The system as claimed in claim 16 further comprising:
the contact layer over the semiconductor die;
a stacked integrated circuit, a flip chip integrated circuit, discrete analog components, or a combination thereof over the contact layer;
a component contact between the stacked integrated circuit, the flip chip integrated circuit, the discrete analog components, or the combination thereof and the contact layer; and
a molded package body on the stacked integrated circuit, the flip chip integrated circuit, the discrete analog components, or the combination thereof, the component contact, the contact layer, and the insulation layer.

20. The system as claimed in claim 16 further comprising:
a heat spreader over the semiconductor die adhered by the adhesive layer;
a stiffener, attached to the heat spreader, adjacent to the semiconductor die and the adhesive layer; and
wherein:

the insulation layer on the semiconductor die includes the insulation layer on the heat spreader, the stiffener, and the adhesive layer.

\* \* \* \* \*